United States Patent
Bai et al.

(10) Patent No.: US 12,359,610 B2
(45) Date of Patent: Jul. 15, 2025

(54) CONTROL METHOD FOR AN AIR INTAKE INTERCOOLER THAT HEATS OR COOLS INTAKE AIR OF AN ENGINE AND A CONTROL SYSTEM THEREOF

(71) Applicant: WEICHAI POWER CO., LTD., Shandong (CN)

(72) Inventors: Ling Bai, Shandong (CN); Deli Zhao, Shandong (CN)

(73) Assignee: WEICHAI POWER CO., LTD., Shandong (CN)

( * ) Notice: Subject to any disclaimer, the term of this patent is extended or adjusted under 35 U.S.C. 154(b) by 0 days.

(21) Appl. No.: 18/038,329

(22) PCT Filed: Feb. 20, 2023

(86) PCT No.: PCT/CN2023/077139
§ 371 (c)(1),
(2) Date: May 23, 2023

(87) PCT Pub. No.: WO2023/221581
PCT Pub. Date: Nov. 23, 2023

(65) Prior Publication Data
US 2024/0352886 A1    Oct. 24, 2024

(30) Foreign Application Priority Data
May 17, 2022    (CN) .......................... 202210538457.2

(51) Int. Cl.
*F02B 29/04*    (2006.01)
*F02M 31/13*    (2006.01)
(Continued)

(52) U.S. Cl.
CPC ...... *F02B 29/0493* (2013.01); *F02B 29/0462* (2013.01); *F02B 29/0481* (2013.01);
(Continued)

(58) Field of Classification Search
CPC .......... F02B 29/04–0493; F02M 31/02; F02M 31/12–135
See application file for complete search history.

(56) References Cited

U.S. PATENT DOCUMENTS 5,375,580 A * 12/1994 Stolz .................... F02M 21/029
123/542
5,547,019 A *  8/1996 Iacullo ................ F02B 29/0456
62/3.61
(Continued)

FOREIGN PATENT DOCUMENTS

CN        106704015 A      5/2017
CN        106979064 A      7/2017
(Continued)

OTHER PUBLICATIONS

1st Chinese Office Action issued in corresponding CN Patent Application No. 202210538457.2 dated Dec. 27, 2022, English Translation.

(Continued)

*Primary Examiner* — Laert Dounis
(74) *Attorney, Agent, or Firm* — George Likourezos; Carter, DeLuca & Farrell LLP

(57) ABSTRACT

Provided are a control method for an air intake intercooler of an engine and a control system thereof, which relates to the technical field of intercoolers. The air intake intercooler includes a primary thermal management unit that can heat and cool intake air. The control method for the air intake intercooler includes acquiring real-time air intake temperature of an air inlet of the intake intercooler; controlling the primary thermal management unit to turn on a heating mode in response to the real-time air intake temperature being lower than a set minimum temperature limit value; and controlling the primary thermal management unit to turn on (Continued)

a cooling mode in response to the real-time air intake temperature being higher than the set maximum temperature limit.

9 Claims, 2 Drawing Sheets

(51) Int. Cl.
*F25B 21/02* (2006.01)
*H10N 10/13* (2023.01)
(52) U.S. Cl.
CPC ............. *F02M 31/13* (2013.01); *F25B 21/02* (2013.01); *H10N 10/13* (2023.02)

(56) References Cited

U.S. PATENT DOCUMENTS

| | | | |
|---|---|---|---|
| 2006/0122762 A1 | 6/2006 | Perkins | |
| 2013/0227932 A1* | 9/2013 | Maione | ............... F02B 29/0475 60/273 |

FOREIGN PATENT DOCUMENTS

| | | | | | |
|---|---|---|---|---|---|
| CN | 112947622 A | * | 6/2021 | ............. | G05D 23/20 |
| CN | 113540498 A | | 10/2021 | | |
| CN | 215595718 U | | 1/2022 | | |
| CN | 114135427 A | | 3/2022 | | |
| CN | 114810333 A | | 7/2022 | | |
| DE | 19954690 A1 | | 5/2001 | | |
| DE | 102007045196 A1 | | 11/2008 | | |
| DE | 102009036740 A1 | | 2/2011 | | |
| DE | 102009036744 A1 | | 2/2011 | | |
| EP | 2634390 A1 | | 9/2013 | | |
| FR | 2880074 A1 | | 6/2006 | | |
| JP | 2007255364 A | | 10/2007 | | |
| JP | 2016-109081 A | | 6/2016 | | |
| JP | 2017145721 A | | 8/2017 | | |
| RU | 2256090 C2 | | 7/2005 | | |
| RU | 2649714 C1 | | 4/2018 | | |
| RU | 2666697 C2 | | 9/2018 | | |
| RU | 2680182 C1 | | 2/2019 | | |
| WO | WO-2004044402 A1 | * | 5/2004 | .......... | F02B 29/0443 |

OTHER PUBLICATIONS

2nd Chinese Office Action issued in corresponding CN Patent Application No. 202210538457.2, dated Feb. 22, 2023, English Translation.
International Search Report issued by China National Intellectual Property Administration in connection with International Application No. PCT/CN2023/077139, dated May 26, 2023.
Extended European Search Report issued by the European Patent Office in connection with International Application No. 23712143.9, dated Nov. 4, 2024.
Russian Office Action issued by the Federal Service for Intellectual Property in connection with International Application No. 2023115612/12, dated Nov. 14, 2024. (Translation).
Japanese Notice of Allowance issued by the Japanese Patent Office in connection with International Application No. 2023-526678, dated Nov. 1, 2024. (Translated).
Japanese Office Action issued by the Japanese Patent Office in connection with International Application No. 2023-526678, dated Jul. 24, 2024. (Translated).

* cited by examiner

CONTROL METHOD FOR AN AIR INTAKE INTERCOOLER THAT HEATS OR COOLS INTAKE AIR OF AN ENGINE AND A CONTROL SYSTEM THEREOF

The present application is a national stage application of International Application No. PCT/CN2023/077139, filed Feb. 20, 2023, which claims priority to Chinese Patent Application No. 202210538457.2 filed with the China National Intellectual Property Administration (CNIPA) on May 17, 2022, the disclosures of which are incorporated herein by reference in-its their entirety.

TECHNICAL FIELD

The present application relates to the technical field of intercoolers, for example, a control method of an air intake intercooler of an engine and a control system thereof.

BACKGROUND

In the related art, the air intake intercooler of an engine is cooled by cooling water, or by the fan and headwind of a vehicle. In this manner, the air can be cooled before entering a cylinder after supercharging.

A disadvantage of the air intake intercooler of an engine in the related art is as follows: (1) The air intake intercooler can only cool the intake air of the cylinder, but fails to achieve a heating function. The air intake temperature may be lower than the optimum air intake temperature range when the engine is started, or when the engine is operated at a low speed and with a low load. (2) The intercooled air intake temperature is strongly related to the ambient air temperature. In particular, when the ambient temperature is high, the intercooled temperature cannot be cooled to the required temperature, leading to the economical efficiency, emission and so on worse. In designing the intercooler, if the intercooler is designed according to the maximum working condition and the maximum ambient temperature boundary, the temperature is low after the intake air under common working conditions is cooled by the air intake intercooler. Moreover, the intercooler has a large design margin and volume, resulting in a waste of costs and space.

SUMMARY

The present application provides a control method for an air intake intercooler of an engine and a control system thereof, which enables an air intake temperature in a cylinder of an engine to be optimized.

The present application provides a control method for an air intake intercooler of an engine. The air intake intercooler includes a primary thermal management unit configured to heat and cool intake air. The control method for an air intake intercooler includes the operations described below.

Real-time air intake temperature of an air inlet of the air intake intercooler is acquired.

The primary thermal management unit is controlled to turn on a heating mode in response to the real-time air intake temperature being lower than a set minimum temperature limit value.

The primary thermal management unit is controlled to turn on a cooling mode in response to the real-time air intake temperature being higher than a set maximum temperature limit value.

The present application further provides a control system of an air intake intercooler of an engine. The control system adopts the control method for an air intake intercooler of an engine as described in any of the preceding solutions. The engine includes an engine electronic control unit (ECU). The air inlet of the air intake intercooler is provided with a temperature sensor configured to detect the real-time air intake temperature of the air inlet of the air intake intercooler. The primary thermal management unit and the temperature sensor are both electrically connected to the engine ECU. The engine ECU controls the primary thermal management unit according to the real-time air intake temperature.

Figure 1:
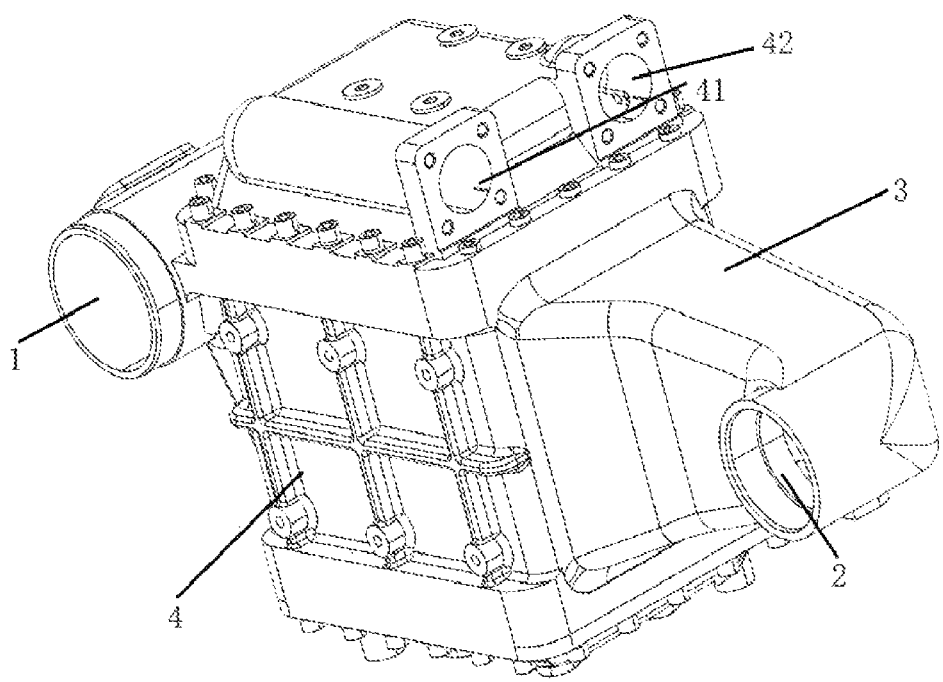
FIG. 1 is a view illustrating the structure of an air intake intercooler of an engine according to embodiment one of the present application.

REFERENCE LIST 1 air inlet
2 air outlet
3 primary thermal management unit
4 secondary thermal management unit
31 P-type semiconductor
32 N-type semiconductor
41 water inlet
42 water outlet

DETAILED DESCRIPTION

Embodiments of the present application are described in detail below. Examples of the embodiments are illustrated in the drawings, where the same or similar reference numerals indicate the same or similar elements or elements having the same or similar functions. The embodiments described below with reference to the drawings are exemplary, intended to explain the present application.

In the description of the present application, it is to be noted that orientations or position relations indicated by terms such as "center", "upper", "lower", "left", "right", "vertical", "horizontal", "in", and "out" are orientations or position relations based on the drawings. These orientations or position relations are intended only to facilitate the description of the present application and simplify the description and not to indicate or imply that a device or element referred to must have such specific orientations or must be configured or operated in such specific orientations. Moreover, terms such as "first" and "second" are used only for the purpose of description and are not to be construed as indicating or implying relative importance. Terms "first position" and "second position" are two different positions.

Unless otherwise expressly specified, the terms "mounted", "connected to each other", "connected" or "fixed" are to be construed in a broad sense, for example, as securely connected, detachably connected, mechanically connected or electrically connected, directly connected to each other, or indirectly connected to each other via an intermediary, or internally connected between two elements or interactional relationships between two elements. For those of ordinary skill in the art, specific meanings of the preceding terms in the present application may be construed according to specific circumstances.

Unless otherwise expressly specified, when a first feature is described as "above" or "below" a second feature, the first feature and the second feature may be in direct contact or be in contact via another feature between the two features instead of being in direct contact. Moreover, when the first feature is "on", "above", or "over" the second feature, the first feature is right on, above, or over the second feature, or the first feature is obliquely on, above, or over the second feature, or the first feature is simply at a higher level than the second feature. When the first feature is "under", "below", or "underneath" the second feature, the first feature is right under, below, or underneath the second feature, or the first feature is obliquely under, below, or underneath the second feature, or the first feature is simply at a lower level than the second feature.

The technical solutions of the present application are described hereinafter in conjunction with drawings and embodiments.

Embodiment One

Figure 2:
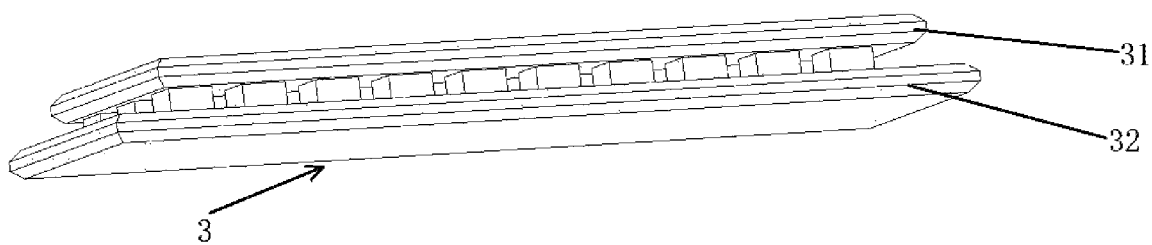
FIG. 2 is a diagram illustrating the structure of a primary thermal management unit according to embodiment one of the present application.

As shown in FIGS. 1 and 2, this embodiment provides a control system of an air intake intercooler of an engine. The engine includes an engine electronic control unit (ECU). An air inlet 1 of the air intake intercooler is provided with a temperature sensor configured to detect real-time air intake temperature of the air inlet 1 of the air intake intercooler. The primary thermal management unit 3 and the temperature sensor are both electrically connected to the engine ECU. The engine ECU controls the primary thermal management unit 3 according to the real-time air intake temperature.

The air intake intercooler includes a secondary thermal management unit 4 that is a water-cooled or an air-cooled structure. The secondary thermal management unit 4 is the same structure as that of the air intake intercooler in the related art. The secondary thermal management unit 4 and the primary thermal management unit 3 are arranged in sequence in the direction from the air inlet 1 of the air intake intercooler to an air outlet 2 of the air intake intercooler. The high-temperature air, after being supercharged by the engine, enters the secondary thermal management unit 4 through the air inlet 1 of the air intake intercooler and is first conventionally cooled by the secondary thermal management unit 4. Then the engine ECU controls the secondary thermal management unit 4 to start a cooling mode, a heating mode, or to stop working according to the real-time air intake temperature of the air inlet 1 of the air intake intercooler detected by the temperature sensor.

Illustratively, the secondary thermal management unit 4 is a water-cooled structure. A water inlet 41 and a water outlet 42 are disposed on one side of the air intake intercooler. Cooling water is supplied to the water-cooled structure through the water inlet 41. The cooling water circulated in the water-cooled structure is discharged through the water outlet 42.

As an optional solution to the control system of the air intake intercooler of an engine, the engine ECU includes a power supply and a switch control module. The switch control module is configured to switch the direction of an output current of the power supply. The primary thermal management unit 3 includes a thermocouple composed of a P-type semiconductor 31 and an N-type semiconductor 32. The P-type semiconductor 31 and the N-type semiconductor 32 are connected to two electrodes of the power supply respectively.

The P-type semiconductor 31 and the N-type semiconductor 32 are separately fixed to the inner wall of the air intake intercooler. The primary thermal management unit 3 is an adjustable part of the air intake intercooler. The intake air cooled by the secondary thermal management unit 4 is heated or cooled by the Peltier effect, so as to achieve the demand of heat dissipation in unusual working conditions. The P-type semiconductor 31 and the N-type semiconductor 32 are made of bismuth antimonide. The N-type semiconductor 32 has excess electrons and a negative temperature difference potential. P-type semiconductor 31 lacks electrons and has a positive temperature difference potential. When an electron passes from the P-type semiconductor 31 through a junction (the interface between the P-type semiconductor 31 and the N-type semiconductor 32) to the N-type semiconductor 32, the energy of the electron is necessarily increased, and the increased energy corresponds to the energy consumed by the junction. On the contrary, when an electron flows from the N-type semiconductor 32 to the P-type semiconductor 31, the temperature of the junction increases. Since the charge carrier is at different energy levels in different semiconductors, when the charge carrier moves from a high level to a low level, excess energy is released to achieve a heating effect: on the contrary, when moving from a low level to a high level, the charge carrier absorbs energy from the outside to achieve a cooling effect. The energy is absorbed or released in the form of heat at the interface of the two semiconductors so that one end of the thermocouple achieves a heating function and the other end of the thermocouple achieves a cooling function. Meanwhile, the Peltieris is reversible. When the direction of the positive and negative poles of the current is changed, the heating and cooling effects at two ends of the thermocouple are changed accordingly.

The P-type semiconductor 31 and the N-type semiconductor 32 are connected to two electrodes of the power supply respectively. The engine ECU performs switch of the positive and negative electrodes of the power supply by the switch control module so as to control the heating or cooling of the primary thermal management unit 3.

The switch control module includes an H-bridge consisting of four switches (solid state or mechanical type). When switches S1 and S4 are closed (S2 and S3 are turned off), a positive voltage is applied to two ends of the power supply, and accordingly, the current is a positive current. When the switches S1 and S4 are turned on, and switches S2 and S3 are turned off, the direction of the voltage is reversed so that a negative voltage is applied to two ends of the power supply, and accordingly, the current is a negative current. The specific connection of the four switches is described herein.

When the real-time air intake temperature is lower than the set minimum temperature limit value, the engine ECU controls the H-bridge to output a forward current so that the primary thermal management unit 3 turns on a heating mode. When the engine is started or is operated at a low speed and with a low load, the air intake temperature may be lower than the set temperature range, and the intake air cooled by the secondary thermal management unit 4 is heated by the primary thermal management unit 3 to reach the optimum air intake temperature range.

When the real-time air intake temperature is higher than the set maximum temperature limit value, the engine ECU controls the H-bridge to output a reverse current so that the primary thermal management unit 3 turns on a cooling mode. When the ambient temperature is relatively high, and the intake air cooled by the secondary thermal management unit 4 cannot reach the optimum air intake temperature range, the engine ECU controls the primary thermal management unit 3 to turn on a cooling mode to continue to cool the intake air cooled by the water so as to reach the optimum air intake temperature range.

As an optional solution to the control system of the air intake intercooler, the switch control module includes a relay that controls the connection and disconnection of the power supply to the thermocouple. When the real-time air intake temperature is within the set temperature range and can reach the optimum air intake temperature range after being cooled by the secondary thermal management unit 4, the relay is controlled by the engine ECU to disconnect the power supply from the thermocouple so that the primary thermal management unit 3 does not working.

According to the control system of the air intake intercooler of the engine provided in this embodiment, the primary thermal management unit 3 in the air intake intercooler is controlled by the engine ECU to turn on a cooling mode or a heating mode so that the air intake temperature in the cylinder of the engine can reach the optimum temperature, and the reliability of the cylinder head, exhaust valve, and exhaust pipe of the engine can be improved.

Embodiment Two

Figure 3:
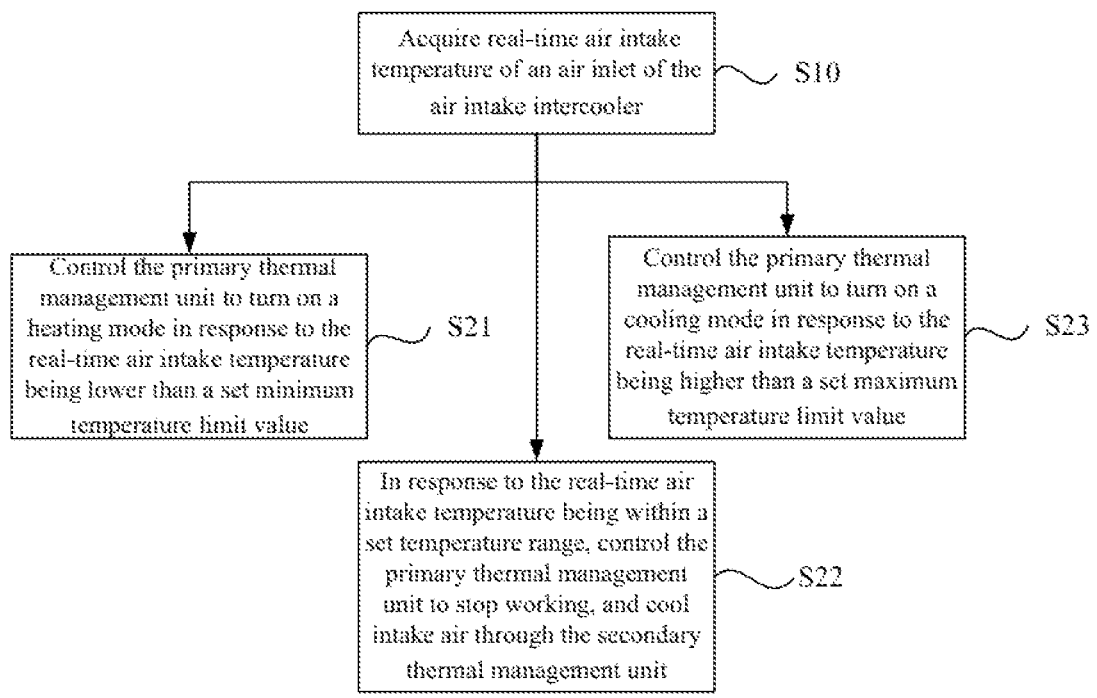
FIG. 3 is a flowchart of a control method for an air intake intercooler of an engine according to embodiment two of the present application.

As shown in FIGS. 1 to 3, this embodiment provides a control method for an air intake intercooler of an engine, which can be applied to the control system of the air intake intercooler of an engine in embodiment one. The air intake intercooler includes a primary thermal management unit 3 configured to heat and cool intake air. The control method for an air intake intercooler includes the steps below.

S10: Real-time air intake temperature of an air inlet 1 of the air intake intercooler is acquired.

The real-time air intake temperature of the air inlet 1 of the air intake intercooler is detected by a temperature sensor which transmits the detected real-time air intake temperature to the engine ECU. The engine ECU stores a set minimum temperature limit value, a set maximum temperature limit value, and a setting program comparing the real-time air intake temperature with the set minimum temperature limit value and the set maximum temperature limit value. After receiving the real-time air intake temperature, the engine ECU judges the real-time air intake temperature according to the setting program.

S21: The primary thermal management unit 3 is controlled to turn on a heating mode in response to the real-time air intake temperature being lower than a set minimum temperature limit.

When determining that the real-time air intake temperature is lower than the set minimum temperature limit value, the engine ECU controls the H-bridge to output a forward current so that the primary thermal management unit 3 turns on a heating mode. The lower real-time air intake temperature, after being cooled by the secondary thermal management unit 4, is heated by the primary thermal management unit 3 to reach the optimum air intake temperature range. In this manner, the requirements for the air intake temperature when the engine is started or when the engine is operated at a low speed and with a low load can be met.

As an optional solution to the control method of the air intake intercooler of an engine, the primary thermal management system includes a thermocouple composed of a P-type semiconductor 31 and an N-type semiconductor 32. The primary thermal management unit 3 is controlled to turn on a heating mode includes controlling electrons of the N-type semiconductor 32 to move toward the P-type semiconductor 31.

When the H-bridge outputs a forward current, excess electrons in the N-type semiconductor 32 flow to the P-type semiconductor 31, and the temperature of the junction increases, releasing excess energy and achieving a heating effect.

The primary thermal management unit 3 is controlled to turn on a cooling mode in response to the real-time air intake temperature being higher than a set maximum temperature limit When determining that the real-time air intake temperature is higher than the set maximum temperature limit value, the engine ECU controls the H-bridge to output a reverse current so that the primary thermal management unit 3 turns on a cooling mode, and the higher real-time air intake temperature is cooled by the secondary thermal management unit 4 and then cooled by the primary thermal management unit 3 to reach the optimum air intake temperature range.

In this manner, the insufficient cooling capacity of the secondary thermal management unit 4, a resultant relatively high air intake temperature at the air intake manifold of the air intake intercooler, and a decrease in engine output power are avoided. Moreover, an increase in engine exhaust temperature and effects on the reliability of the engine cylinder head, exhaust valve, and exhaust pipe are prevented.

An optional solution to the control method for the air intake intercooler of an engine is as follows: the primary thermal management unit 3 is controlled to turn on a cooling mode includes electrons of the P-type semiconductor 31 are controlled to move toward the N-type semiconductor 32.

When the H-bridge outputs a reverse current, and electrons in the P-type semiconductor 31 pass through the junction to the N-type semiconductor 32, the electrons energy is necessarily increased, and the increased energy corresponds to the energy consumed by the junction. The electrons in the P-type semiconductor 31 absorb energy from the outside, thereby achieving a cooling effect.

S22: In response to the real-time air intake temperature being within a set temperature range, the primary thermal management unit 3 is controlled to stop working, and intake air is cooled through the secondary thermal management unit 4

In response to the real-time air intake temperature is within the set temperature range, and intake air can reach the optimum air intake temperature range after being cooled by the secondary thermal management unit 4, the relay is controlled by the engine ECU to disconnect the power supply from the thermocouple. In this manner, the primary thermal management unit 3 does not work.

An optional solution to the control method for the air intake intercooler of an engine is as follows: The set temperature range is between the set minimum temperature limit value and the set maximum temperature limit value.

Alternatively, the set minimum temperature limit value is 15° C. to 25° C. The set maximum temperature limit is 65° C. to 75° C. In this embodiment, the set minimum temperature limit value is 20° C. The set maximum temperature limit value is 70° C. When the temperature at the intake manifold of the engine is in the normal temperature range, such as 20° C.≤T≤70° C., the power supply is disconnected from the thermocouple by the engine ECU controlling the relay, that is, the primary thermal management unit 3 does not work, the heating or cooling of the intake air is stopped, and the intake air is completely cooled by the water cooling structure of the secondary thermal management unit 4.

According to the control method of the air intake intercooler of the engine provided in this embodiment, the real-time air intake temperature of the air inlet 1 of the intake intercooler is acquired, and the primary thermal management unit 3 is controlled according to the real-time air intake temperature. In response to the real-time air intake temperature being lower than the set minimum temperature limit value, the primary thermal management unit 3 is controlled to turn on a heating mode. In this manner, the intake air can be heated, thereby ensuring that the air intake temperature in the cylinder of the engine reaches an optimum temperature at a low speed and with a low load. The primary thermal management unit 3 is controlled to turn on a cooling mode in response to the real-time air intake temperature being higher than the set maximum temperature limit value. When the air intake temperature is relatively high, the output power of the engine is easily reduced, and the exhaust temperature of the engine is increased, which greatly affects the reliability of the cylinder head, the exhaust valve, and the exhaust pipe of the engine. The primary thermal management unit 3 is controlled to cool the intake air so that the cost and the space waste are avoided, the cost of the engine is reduced, and the emission performance is good. The waste of cost and space is caused by the large volume and design margin of the air intake intercooler due to the maximum working condition and the maximum ambient temperature boundary design when the air intake intercooler is designed.

What is claimed is:

1. A control method for an air intake intercooler of an engine, wherein the air intake intercooler comprises a primary thermal management unit and a secondary thermal management unit, wherein the secondary thermal management unit and the primary thermal management unit are arranged in sequence in a direction from an air inlet of the air intake intercooler to an air outlet of the air intake intercooler, and the primary thermal management unit is configured to heat and cool intake air, and the control method for an air intake intercooler comprises:
   cooling, by the secondary thermal management unit, the intake air, wherein the intake air enters the secondary thermal management unit through the air inlet of the air intake intercooler;
   acquiring real-time air intake temperature of an air inlet of the air intake intercooler, and controlling the primary thermal management unit to start a cooling mode, a heating mode, or to stop working according to the real-time air intake temperature;
   in response to the real-time air intake temperature being within a set temperature range, controlling the primary thermal management unit to stop working, and cooling the intake air through the secondary thermal management unit;
   controlling the primary thermal management unit to turn on the heating mode in response to the real-time air intake temperature being lower than a set minimum temperature limit value; and
   controlling the primary thermal management unit to turn on the cooling mode in response to the real-time air intake temperature being higher than a set maximum temperature limit value;
   wherein the primary thermal management unit comprises a thermocouple composed of a P-type semiconductor and an N-type semiconductor, and the secondary thermal management unit comprises a water-cooled intercooler or an air-cooled structure intercooler.

2. The control method for an air intake intercooler of an engine according to claim 1, wherein the set temperature range is between the set minimum temperature limit value and the set maximum temperature limit value.

3. The control method for an air intake intercooler of an engine according to claim 1, wherein
   the controlling the primary thermal management unit to turn on a heating mode comprises:
   controlling electrons of the N-type semiconductor to move towards the P-type semiconductor.

4. The control method for an air intake intercooler of an engine according to claim 3, wherein the controlling the primary thermal management unit to turn on a cooling mode comprises:
   controlling electrons of the P-type semiconductor to move towards the N-type semiconductor.

5. The control method for an air intake intercooler of an engine according to claim 1, wherein the set minimum temperature limit value is between 15° C. to 25° C.

6. The control method for an air intake intercooler of an engine according to claim 1, wherein the set maximum temperature limit value is between 65° C. to 75° C.

7. A control system of an air intake intercooler of an engine adopting the control method for an air intake intercooler of an engine according to claim 1, the secondary thermal management unit is configured to cool the intake air;
   wherein the engine comprises an engine electronic control unit (ECU), the air inlet of the air intake intercooler is provided with a temperature sensor configured to detect the real-time air intake temperature of the air inlet of the air intake intercooler,
   the primary thermal management unit and the temperature sensor are electrically connected to the engine ECU, and the engine ECU is configured to acquire real-time air intake temperature of an air inlet of the air intake intercooler controller, and control the primary thermal management unit to start a cooling mode, a heating mode, or to stop working according to the real-time air intake temperature;
   the engine ECU is configured to, in response to the real-time air intake temperature being within a set temperature range, control the primary thermal management unit to stop working, and the intake air is cooled through the secondary thermal management unit;
   the engine ECU is configured to, in response to the real-time air intake temperature being lower than a set minimum temperature limit value, control the primary thermal management unit to turn on the heating mode;
   the engine ECU is configured to, in response to the real-time air intake temperature being higher than a set maximum temperature limit value, control the primary thermal management unit to turn on the cooling mode;
   wherein the primary thermal management unit comprises a thermocouple composed of a P-type semiconductor and an N-type semiconductor, and the secondary thermal management unit comprises a water-cooled intercooler or an air-cooled structure intercooler.

8. The control system of an air intake intercooler of an engine according to claim 7, wherein the engine ECU comprises a power supply and a switch control module, the switch control module is configured to switch a direction of an output current of the power supply, and the P-type semiconductor and the N-type semiconductor are connected to two electrodes of the power supply respectively.

9. The control system of an air intake intercooler of an engine according to claim 8, wherein the switch control module comprises a relay configured to control connection and disconnection of the power supply to the thermocouple.

* * * * *